(12) United States Patent
    Wainerdi et al.

(10) Patent No.: US 11,082,028 B2
(45) Date of Patent: *Aug. 3, 2021

(54) 3D-PRINTED PROTECTIVE SHELL STRUCTURES WITH SUPPORT COLUMNS FOR STRESS SENSITIVE CIRCUITS

(71) Applicant: Texas Instruments Incorporated, Dallas, TX (US)

(72) Inventors: James Cooper Wainerdi, Plano, TX (US); Luu Nguyen, San Jose, CA (US); Alexander Harvey Scheuermann, Dallas, TX (US); Matthew David Romig, Wylie, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/724,681

(22) Filed: Dec. 23, 2019

(65) Prior Publication Data

US 2020/0127637 A1    Apr. 23, 2020

Related U.S. Application Data

(63) Continuation of application No. 15/858,892, filed on Dec. 29, 2017, now Pat. No. 10,516,381.

(51) Int. Cl.
    *H03H 9/10*      (2006.01)
    *H01L 23/495*    (2006.01)
    (Continued)

(52) U.S. Cl.
    CPC .......... *H03H 9/1042* (2013.01); *B29C 64/00* (2017.08); *B33Y 80/00* (2014.12); *B81B 7/0051* (2013.01);
    (Continued)

(58) Field of Classification Search
    CPC ............ H03H 9/10–1092; H01L 23/24; H01L 23/28–3192; H01L 23/3675; H01L 23/562; H01L 41/23; H01L 41/053; H01L 41/0533; H01L 2924/161–16798; H01L 2924/181–186; H01L 21/56; H01L 23/315; H01L 21/02282–0229; H01L 21/02623–02628; H01L 51/0004–0006; B81B 7/0045–0054; B81B 7/0058;
    (Continued)

(56) References Cited

U.S. PATENT DOCUMENTS

10,516,381 B2 * 12/2019 Wainerdi .............. B81B 7/0058
2008/0067667 A1    3/2008 Mahler et al.
(Continued)

*Primary Examiner* — Younes Boulghassoul
(74) *Attorney, Agent, or Firm* — Dawn Jos; Charles A. Brill; Frank D. Cimino (57) ABSTRACT

In one aspect of the disclosure, a semiconductor package is disclosed. The semiconductor package includes a lead frame. A semiconductor die is attached to a first side of the lead frame. A protective shell covers at least a first portion of the first surface of the semiconductor die. The protective shell comprises of ink residue. A layer of molding compound covers an outer surface of the protective shell and exposed portion of the first surface of the semiconductor die. A cavity space is within an inner space of the protective shell and the first portion of the top surface of the semiconductor die.

19 Claims, 6 Drawing Sheets

(51) Int. Cl.
*H01L 23/31* (2006.01)
*B81B 7/00* (2006.01)
*H01L 23/18* (2006.01)
*B29C 64/00* (2017.01)
*B33Y 80/00* (2015.01)
*H01L 21/02* (2006.01)
*H01L 23/433* (2006.01)
*H01L 41/053* (2006.01)
*H01L 41/23* (2013.01)

(52) U.S. Cl.
CPC ...... *B81B 7/0058* (2013.01); *H01L 21/02118* (2013.01); *H01L 21/02288* (2013.01); *H01L 23/18* (2013.01); *H01L 23/315* (2013.01); *H01L 23/3107* (2013.01); *H01L 23/4334* (2013.01); *H01L 23/4952* (2013.01); *H01L 23/49513* (2013.01); *H01L 23/49531* (2013.01); *H01L 23/49568* (2013.01); *H03H 9/10* (2013.01); *B81B 2203/0315* (2013.01); *B81C 2203/0154* (2013.01); *H01L 23/49548* (2013.01); *H01L 41/0533* (2013.01); *H01L 41/23* (2013.01)

(58) Field of Classification Search
CPC .......... B81B 7/0077; B81B 2203/0315; B81C 2203/0136; B81C 2203/0154; B81C 2203/0163; B81C 1/00325; B29C 64/00–40; B33Y 80/00
See application file for complete search history.

(56) References Cited

U.S. PATENT DOCUMENTS

| | | | |
|---|---|---|---|
| 2010/0065929 A1* | 3/2010 | Okada | H01L 27/14618 257/415 |
| 2012/0286405 A1 | 11/2012 | Toyota | |
| 2015/0035091 A1 | 2/2015 | Ziglioli | |
| 2015/0249043 A1* | 9/2015 | Elian | H01L 23/3121 257/684 |
| 2016/0093525 A1 | 3/2016 | Cook et al. | |
| 2016/0172309 A1 | 6/2016 | Gong et al. | |
| 2016/0204073 A1 | 7/2016 | Beak et al. | |
| 2017/0162461 A1 | 6/2017 | Schwab et al. | |
| 2017/0197823 A1 | 7/2017 | Wachtler et al. | |
| 2018/0308756 A1 | 10/2018 | Kim et al. | |

\* cited by examiner

3D-PRINTED PROTECTIVE SHELL STRUCTURES WITH SUPPORT COLUMNS FOR STRESS SENSITIVE CIRCUITS

This application is a continuation of U.S. patent application Ser. No. 15/858,892, filed Dec. 29, 2017, the contents of which are herein incorporated by reference in its entirety.

BACKGROUND

This disclosure relates generally to the field of microelectronics and more specifically to packaging of stress sensitive circuits such as micro-electro-mechanical systems (MEMS).

Semiconductor dies are microscopic electronic devices that are commonly developed in a semiconductor fabrication process. The semiconductor fabrication process may include multiple steps of depositing material layers, patterning by photolithography techniques, and etching the layers to create the required shapes on wafers. A wafer with a large number of semiconductor dies are generated at the conclusion of the fabrication process. The semiconductor dies within a wafer are packaged in a semiconductor package. In wafer-level packaging, the packaging and interconnections is fabricated on the wafer before dicing may (while the semiconductor dies are still part of the wafer). Alternatively, each individual die on the wafer is separated using operations such as wafer back-grinding and wafer dicing before the semiconductor dies are packaged.

The semiconductor dies are packaged in semiconductor packages that are designed to form electrical connections between the die and an underlying substrate (e.g., a printed circuit board (PCB)). The supporting case also protects the dies from contaminations, moisture, and scratches. However, more sensitive dies may need unique packaging considerations. For example, in case of high performance MEMS devices, at least a portion of the die is covered by low modulus materials (e.g., silicone glob top) to protect or mechanically isolate the die against external stresses, which may affect the semiconductor die performance, while still providing a degree of flexibility for the intended vibration, motion or performance of the device.

SUMMARY

In one aspect of the disclosure, a semiconductor package is disclosed. The semiconductor package includes a lead frame. A semiconductor die is attached to a first side of the lead frame. A protective shell covers at least a first portion of the first surface of the semiconductor die. The protective shell comprises of ink residue. A layer of molding compound covers an outer surface of the protective shell and exposed portion of the first surface of the semiconductor die. A cavity space is within an inner space of the protective shell and the first portion of the top surface of the semiconductor die.

In another aspect of the disclosure, a semiconductor package includes an interposer having a first side and second side. A lead frame is attached to the second side of the interposer. A semiconductor die is attached to the first side of the interposer. An exposed surface of the first side of the interposer is not covered by the semiconductor die. A protective shell comprising of ink residue is formed on the exposed surface of the interposer such that the semiconductor die is positioned within an inner space of the protective shell. A layer of molding compound covers an outer surface of the protective shell and a remaining portion of the exposed surface of the first side of the interposer. A cavity space is formed by the inner space of the protective shell and a first surface of the semiconductor die covered by the protective shell.

In yet another aspect of the disclosure, a semiconductor package includes a semiconductor die having a first surface. A protective shell comprising ink residue covers a first portion of at least one of the plurality of semiconductor dies. The protective shell creates a hermetic seal with the first surface of the semiconductor die. A cavity space is formed within an inner space of the protective shell above the covered portion of the first surface of the semiconductor die.

BRIEF DESCRIPTION OF THE DRAWINGS

For a detailed description of various examples, reference will now be made to the accompanying drawings in which.

DETAILED DESCRIPTION

In accordance with at least one aspect of the disclosure, a semiconductor package is disclosed. In this aspect of disclosure, at least a portion of a semiconductor die is covered by a protective shell. The protective shell is formed using 3D printing devices. In one example, the protective shell forms an air-cavity above the covered portion of the semiconductor die. In one implementation, the air-cavity is filled with thermally conductive, electrically insulating, and/or non-capacitive compound or fluid (e.g., thermal grease). The protective shell allows an optimal operation of the semiconductor die by providing sufficient support against the stress caused by the encapsulating material of the package.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Figure 1:
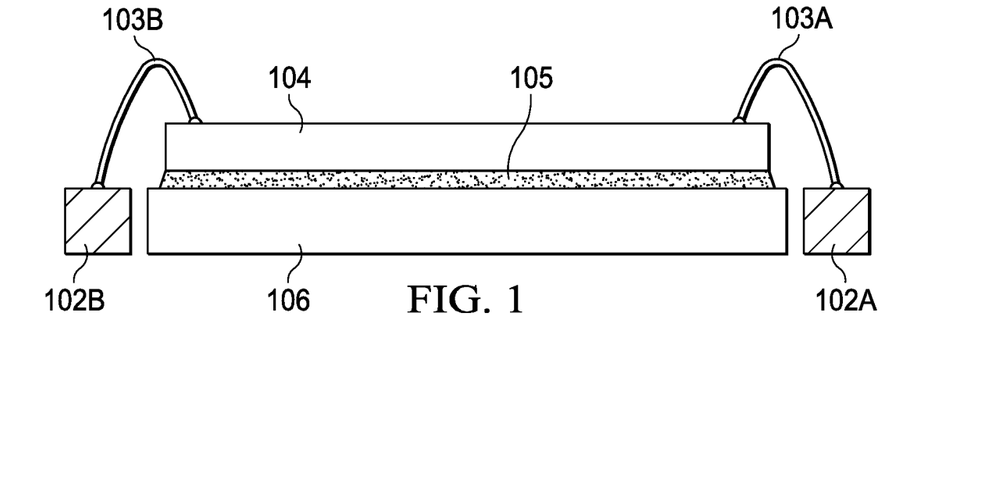
FIG. 1 illustrates a cross-sectional view a semiconductor die without the protective shell according to an implementation of the disclosure.

Referring to FIG. 1, a cross-sectional view of a semiconductor die without the protective shell is shown. The semiconductor die described in this disclosure may be fabricated by any conventional semiconductor operations. Furthermore, while FIG. 1 depicts the semiconductor die 104 at the package-level, as discussed further below, some implementations of the disclosure is performed at the wafer-level (i.e., before slicing the wafer into individual dice).

The semiconductor die 104 of FIG. 1 is used in various devices including data converters, voltage references, memories, accelerometers, microengines, resonators (e.g., bulk acoustic wave (BAW) devices), optical switches, gyroscopic devices, sensors, MEMS, and actuators. The semiconductor die 104 is placed on a die attach pad of a lead frame 106 using a die attach layer 105. The semiconductor die 104 includes a plurality of bond pads on its top surface for communication of electrical signals to one or more input/output (I/O) pads. For example, the wire bonds 103A and 103B connect the one or more bond pads of the semiconductor die 104 to the leads 102A and 102B. The leads 102A and 102B may be lead fingers of a lead frame. When installed in appropriate device, the leads 102A and 102B communicate the electrical signals between the semiconductor die 104 and the underlying substrate (e.g., PCB).

In one implementation, the protective shell described in this disclosure is formed before dicing of the wafer. In another implementation, before the semiconductor package is encased in molding compound (e.g., epoxy compound), the protective shell is formed on the semiconductor die 104. Conventionally, a glop-top is used to cover the semiconductor die 104 and its bond pads. The glop-top consists of drops of particularly formulated epoxy or silicon. Disclosed implementations describe a protective shell formed by 3D printing technology. The protective shell creates a cavity space above the die. In implementations of the disclosure, the cavity space is filled with air, inert gas, or conductive material. The cavity space within the protective shell allows for free vibration, motion or performance of the die while providing the required mechanical support and protection against moisture and contamination.

Figure 2A:
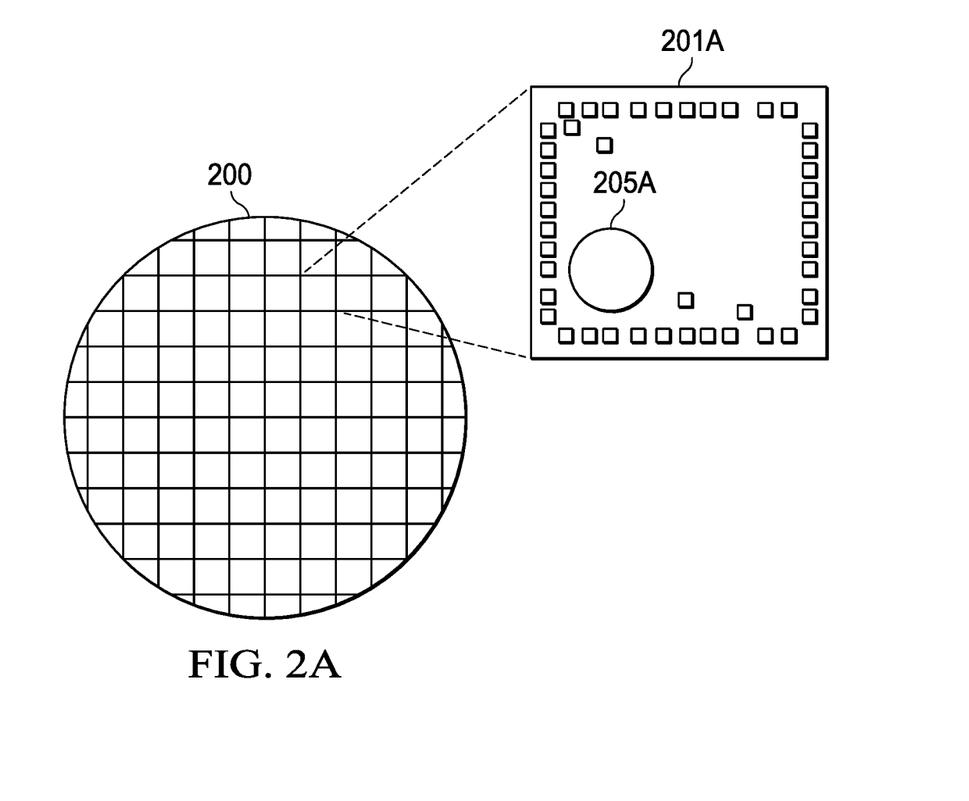
FIG. 2A illustrates a top view of a footer for a protective shell on a semiconductor die at a wafer-level according to an implementation of the disclosure.
Figure 2B:
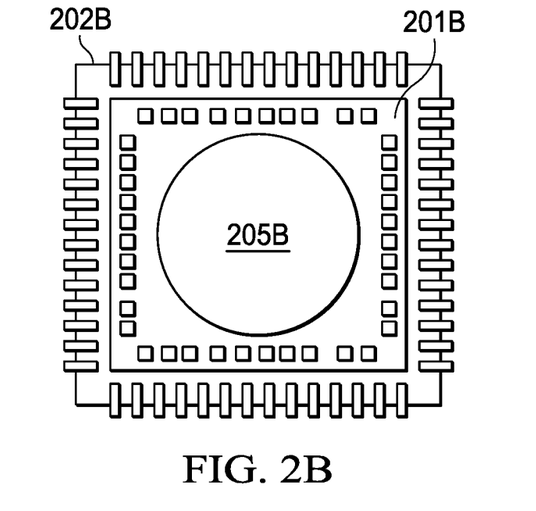
FIG. 2B illustrates a top view of a footer for a protective shell on a semiconductor die at a package-level according to an implementation of the disclosure.
Figure 2C:
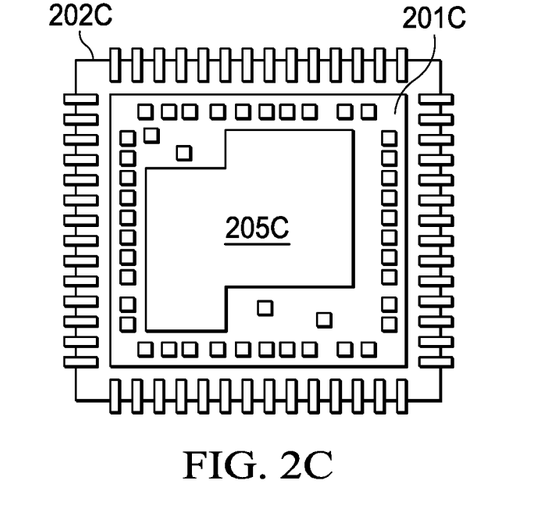
FIG. 2C illustrates a top view of a footer for a protective shell on a semiconductor die at a package-level according to an implementation of the disclosure.

Referring to FIGS. 2A to 2C, a placement of a footer for a protective shell on a semiconductor die is described according to the implementations of the disclosure. FIG. 2A shows a top view of one or more footers (e.g., the footer 205A) that are formed on one or more semiconductor dies (e.g., the semiconductor die 201A) of the wafer 200 at the wafer-level. Therefore, in FIG. 2A, the formation of the footer 205A occurs before dicing of the wafer 200. Alternatively, FIGS. 2B and 2C show a top view of the footers 205B and 205C after semiconductor dies 201B and 201C are attached to the lead frames 202B and 202C (e.g., a lead frame).

The footer 205 (referring to each of the footers 205A, 205B, and 205C individually), provides a base for formation of the protective shell on the top surface of the semiconductor die 201 (referring to each of the semiconductor die 201A, 201B, and 201C individually). The semiconductor die 201 is fabricated by any conventional semiconductor processes. In one example, the footer 205 is simply a pattern drawn on the top surface of the semiconductor die 201 by photolithography operations. In other examples, the footer 205 provides a groove on which the protective shell is built. The groove helps with formation of a better hermetic seal between the protective shell and the top surface of the semiconductor die. In yet another implementation, the footer 205 is patterned edges formed on the top surface of the semiconductor die 201. Such an implementation help with stabilizing the protective shell on the top surface. The footer 205 also prevents the protective shell from causing a short in the semiconductor die's circuitry. In other examples, the footer surface is also textured or roughened with 3D printed materials to improve the contact seal.

In an implementation, the footer 205 is formed with the same material as a top layer of the semiconductor die 201. For example, the layout of the semiconductor die 201 has a metal top layer (e.g., metal-3 elements). Alternatively, to get a better current carrying capabilities, a copper top or MetDCu is used as a portion of the top layer of the semiconductor die 201. In such examples, the footer 205 is formed by the top metal layer, the copper top, or MetDCu.

The footer 205 is formed in various shapes and sizes. For example, referring to FIG. 2A, the footer 205A is formed on a small portion of the semiconductor die 201A. In an example, the footer 205A is drawn around a BAW circuit, occupying only a portion of the semiconductor die 201A. A stress sensitive BAW circuit may include a piezoelectric material sandwiched between two electrodes to act as clock source or filter with timing accuracy requirements measured in the parts per million (ppm). Alternatively, the footers 205B and 205C encompass majority of the surfaces of the semiconductor die 201B and 201C. In different implementations, the footer 205 is formed in shapes such as circle, ellipse, quadrilateral, rectangle, trapezoid, pentagon, and etc. The shape and size of the footer 205 is determined based on the portion of the semiconductor die 201 that is intended for protection by the protective shell.

Figure 3A:
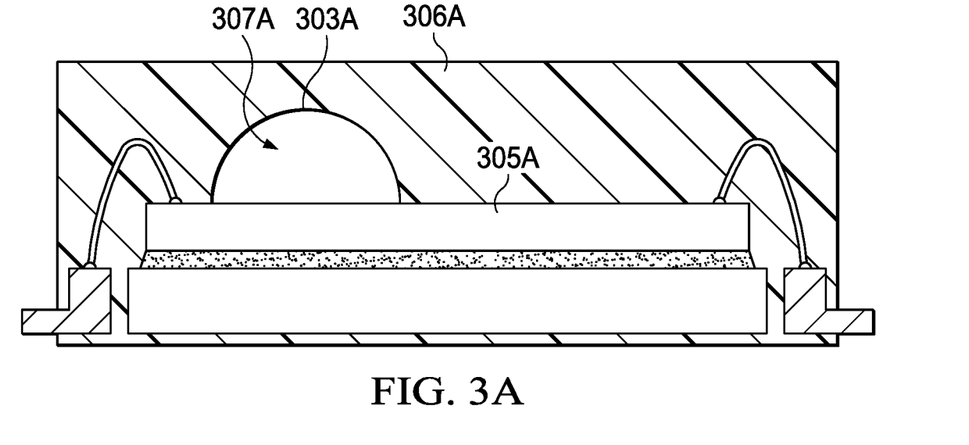
FIG. 3A illustrates a cross-sectional view of a partial protective shell having a geodesic dome shape on a semiconductor die according to an implementation of the disclosure.
Figure 3B:
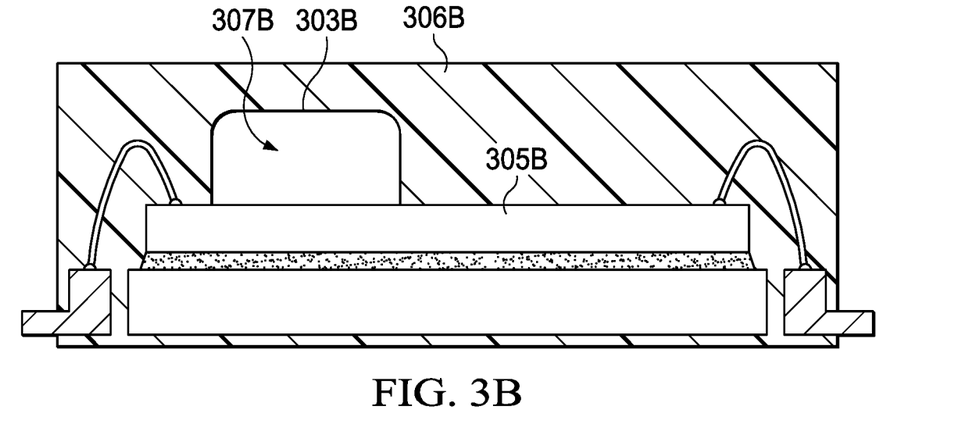
FIG. 3B illustrates a cross-sectional view of a partial protective shell having a rounded edge cuboid shape on a semiconductor die according to an implementation of the disclosure.

FIGS. 3A and 3B illustrate partial protective shells formed on semiconductor dies according to different implementations. FIG. 3A illustrates a cross-sectional view of a partial protective shell having a geodesic dome shape according to an implementation of the disclosure. FIG. 3B illustrates a cross-sectional view of a partial protective shell having a rounded edge cuboid shape according to another implementation of the disclosure. The protective shell 303 (referring to each of the protective shells 303A and 303B individually) is formed on top of the footer described with reference to FIGS. 2A to 2C. The protective shell 303 covers at least a portion of the top surface of the semiconductor die 301 (referring to each of the semiconductor die 301A and 301B individually). For example, the protective shell 303 only covers a portion of the semiconductor die 301 consisting of a BAW circuit.

In an implementation, the protective shell 303 is formed by 3D printing devices. For example, a 3D printer is used to deposit layers of ink on the top surface of the semiconductor die 301 to form the 3D structure of the protective shell 303. The layers of ink include materials that are either solid (e.g., particles, such as nanoparticles) or a precursor for a solid that forms a solid (e.g., particles) upon curing or sintering a liquid carrier that includes a solvent and/or a dispersant. For example in the case of a precursor for a solid, the ink can be, for example, a sinterable metal ink or a UV-curable polymer or a UV-curable polymer-based mixture. In an implementation, for example in inkjet printing, the layers of ink include 60-70% solvent which evaporates upon drying and leave the solid residues (e.g., metals or dielectric polymers). The solid residues may be referred to as "ink", "ink residue", or "printed ink materials". In other implementations, for example non-inject printing, the printed ink materials are melted solids materials (e.g., thermoplastics) deposited on the die.

The ink is additively depositable by an ink printing apparatus (i.e. 3D printer). The ink printing apparatus can comprise an inkjet printer that uses piezoelectric, thermal, or acoustic or electrostatics, an aerosol jet, stencil, microdeposition printer, or a screen or flexographic printer. The inkjet printer can be selected from any of a number of commercially available or customized inkjet printers. Alternatively, a customized inkjet printer can be designed to work for the specific nanoink. In further embodiments, a series of inkjet printers can be used, such as where several different distinct nanoinks are to be printed. Such different nanoinks may comprise different metals, may be printed in interactive patterns or layouts, and/or may be printed atop one another, such as after a cure process for each one.

The materials used in ink layers are selected to provide sufficient adhesion to the top layer of the semiconductor die 301. In one implementation, adhesion promoters are added to the ink materials to ensure proper bonding. In an example, the protective shell 303 is made of metal ink residue such as nano-Copper and Silver (Ag). In another example, the protective shell is made of ceramic materials (e.g., 3D printable resin form). Finally, in another instance, thermoplastic materials are used.

In the case of a metal ink including metal nanoparticles, the sintering can take place at a temperature typically between 60° C. and 200° C. However, the sintering or curing temperature may be limited to 60° C. to 100° C. in the case of plastic or other low heat tolerance packaging material.

The 3D printing technology facilitates formation of the protective shell 303 in any shape, size, or geometry based on a digital 3D model. For example, referring to FIG. 3A, the protective shell 303A is shaped as a geodesic dome (i.e., a hemispherical thin shell structure made of triangular elements). In an example, the geodesic dome has a diameter of 1 mm and a height of 0.5 mm. In another example, referring to FIG. 3B, the protective shell 303B is shaped as a rounded edge cuboid. The rounded edge cuboid has a width of 1 mm and a height of 0.5 mm. Furthermore, the sidewalls of the protective shell 303 has a varying thickness. For example, the sidewalls may be thicker on the bottom, where it is attached to the semiconductor die 301, and they may become thinner toward the top. A thicker sidewalls on the bottom provides a better adhesion and seal when the protective shell 303 is printed on the semiconductor die 301. In an implementation, the sidewalls have a thickness of 0.3 mm.

The packaging process includes covering the semiconductor die 303 by molding compound 306 (e.g., epoxy compound). Therefore, the structure of protective shell 303 must be strong enough to withstand the static forces that are incurred during the mold cure and injection. The strength of the structure depends on the thickness of the walls, forming materials, and shape of the protective shell. In an example, the structure of the protective shell 303 is designed to withstand the transfer mold forces (e.g. in excess of 1000 psi (0.7 kg/mm2)).

As discussed previously, the protective shell 303 can be formed either on wafer-level or after the dicing of the wafer. Forming the protective shell on-wafer level is more cost effective. In this method, protective shells are formed for one or more dies of the wafer using 3D printing technology. Then, the wafer goes through a singulation operation by dicing the wafer into a plurality of separate dies for assembly. Each die is attached to a die attach pad of a lead frame. Subsequently, the wire bonding operations are performed to direct the electrical signals in and out of the die. The die including the protective shell is finally covered by molding materials.

In alternative method, the protective shells are formed after singulation operation. As such, individual dies are attached to the lead frames. A wafer plasma pre-treatment is performed to facilitate wetting and adhesion of the ink used for printing. Plasmas typically used are either Oxygen or a mixture of Argon and Oxygen. Then the protective shell are printed and the semiconductor package is sent to a bake to dry/cure step. In an implementation, UV snap cure may be used for a faster result. Finally, the wire bonding and molding operations are performed to complete the process.

Referring back to FIGS. 3A and 3B, the protective shell 303 prevents injection of the molding material to inner cavity of the shell structure. Therefore, a cavity space 307 (referring to the cavities 307A and 307B individually) is formed above the protected surface of the semiconductor die 301. In an implementation, the cavity 307 is an air cavity. Air provides a better accommodation for the vibration, motion or performance of the protected portion of the semiconductor die 301 than a silicone glop top. In other implementations, a vacuum/partial vacuum is pulled in the cavity 307. The vacuum or partial vacuum is pulled within the cavity by 3D printing of the required valves used in a conventional vacuum purging process. In yet another implementation, an inert gas is purged within the cavity 307. To purge the cavity 307 with an inert gas, the area surrounding the die is blanketed by the inert gas shroud while forming the protective shell 303. The volume within the cavity 307 may also be filled with non-electrically conductive, but thermally conductive, and non-capacitive material (e.g., thermal grease). Such techniques help with thermal dissipation of the semiconductor die 301.

Figure 4A:
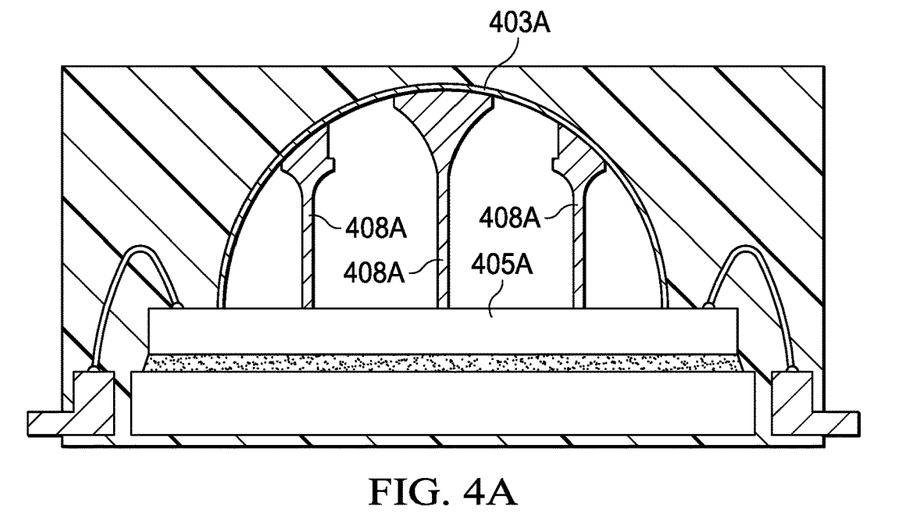
FIG. 4A illustrates a cross-sectional view of a partial protective shell having a dome shape including a plurality of support columns according to an implementation of the disclosure.
Figure 4B:
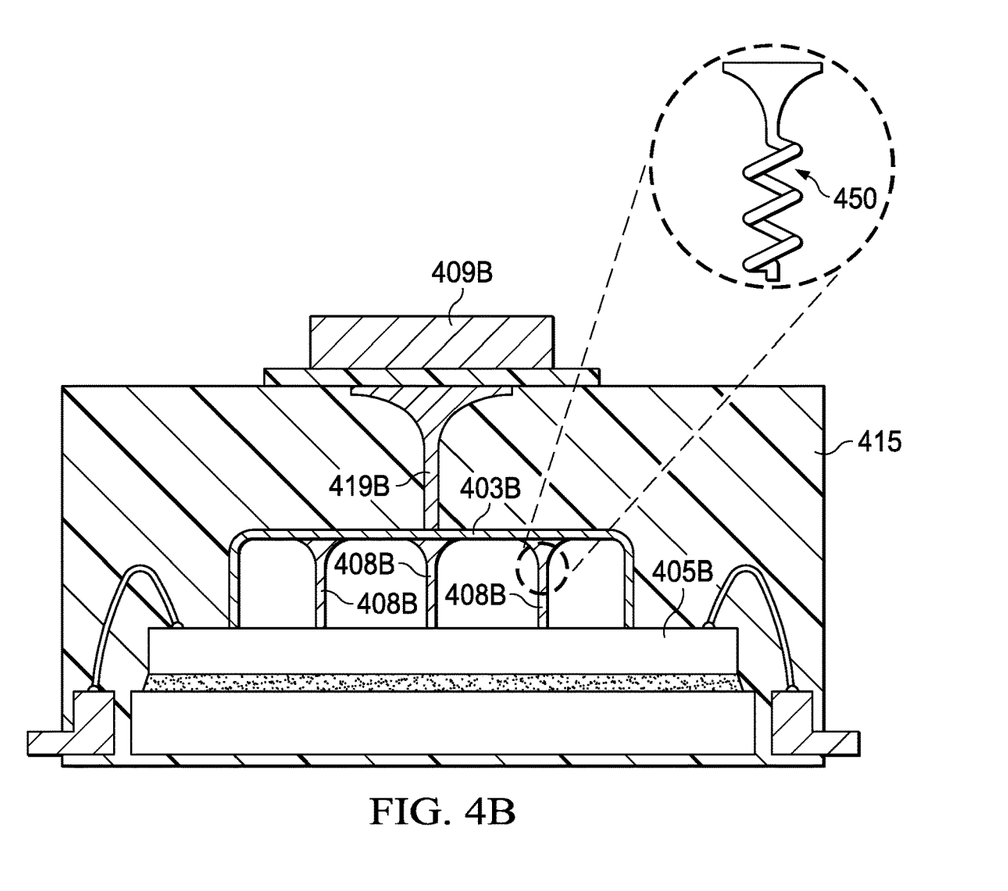
FIG. 4B illustrates a cross-sectional view of a partial protective shell including a plurality of support columns and a heat sink according to an implementation of the disclosure.

To further strengthen the protective shell structure against the stress and strain of the package, one or more supporting columns are formed within the inner cavity of the shell. Referring to FIGS. 4A and 4B, cross-sectional views of protective shells including a plurality of support columns are shown according to different implementations of the disclosure.

Referring to FIG. 4A, a protective shell 403A is formed in a dome shape, having a plurality of support columns 408A in various heights. In an example, the support columns 408A are as tall as the height of the protective shell 403A. In an implementation, the head portion of the support columns 408A is shaped based on the curvature on the inner surface of the protective shell 403A so to provide enough contact between the shell structure and the support columns 408A. Referring to FIG. 4B, a protective shell 403B is formed in a cuboid shape, having a plurality of support columns 408B in an equal height. In an example, the head portion of the support columns 408B has a flat surface.

In an implementation, the support columns 408 (referring to each of the support columns 408A and 408B individually) is formed at the same time as the protective shell 403 (referring to each of the protective shells 403A and 403B individually). For example, the 3D printer utilized to form the protective shells 403 also prints the support columns 408 at the same time. In such an instance, the support columns 408 are part of the protective shell 403. In an implementation, the support columns 408 are made of the same material as the protective shell 403. In another implementation, the support columns 408 are designed to include mechanical isolation dampers as shown by arrow 450 to reduce the effects of stress or strain on the protective shell structure. The number of support columns 408 depends upon the size, shape, and the desired strength of the protective shell 403. In an implementation, no support columns are necessary while in other implementations one or more support columns are used.

The bases of the support columns 408 are placed on the top surface of the semiconductor die 401 while the head portion of the support columns 408 are connected to the top inner surface of the protective shell 403. The placement of the support columns on the semiconductor die 401 are such that no interference occurs with the operation of the semiconductor die (e.g., no electrical shorts). In an instance, the support columns 408 are made of thermally and/or electrically conductive material. In this implementation, the support columns 408 is used to conduct heat out of the top surface of the semiconductor die 401.

Referring to FIG. 4B, in an implementation, a heat sink 409B is placed on the outer surface of the semiconductor package 415. Then, a second group of one or more columns (e.g., column 419B) are used to connect the top outer surface of the protective shell 403B to the heat sink 409B. The heat sink 409B may be directly connected to column 419B or it may be connected through additional layers of thermal grease and/or molding compound. The heat sink 409B facilitates dissipation of heat from the protective shell 403B. In at least one other implementation, the column 419B is directly connected to the top surface of the semiconductor die 401B and no protective shell is used.

Figure 5A:
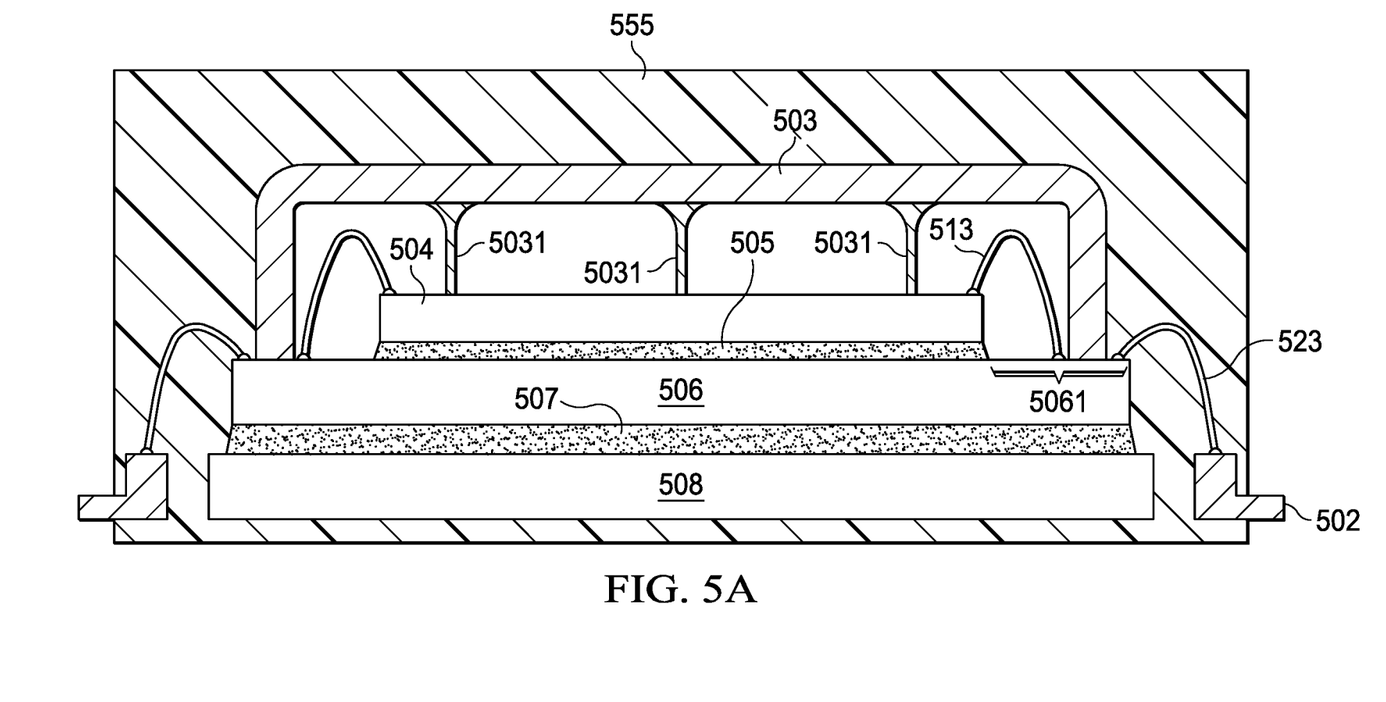
FIG. 5A illustrates a cross-sectional view of a full protective shell having a cuboid shape according to an implementation of the disclosure.
Figure 5B:
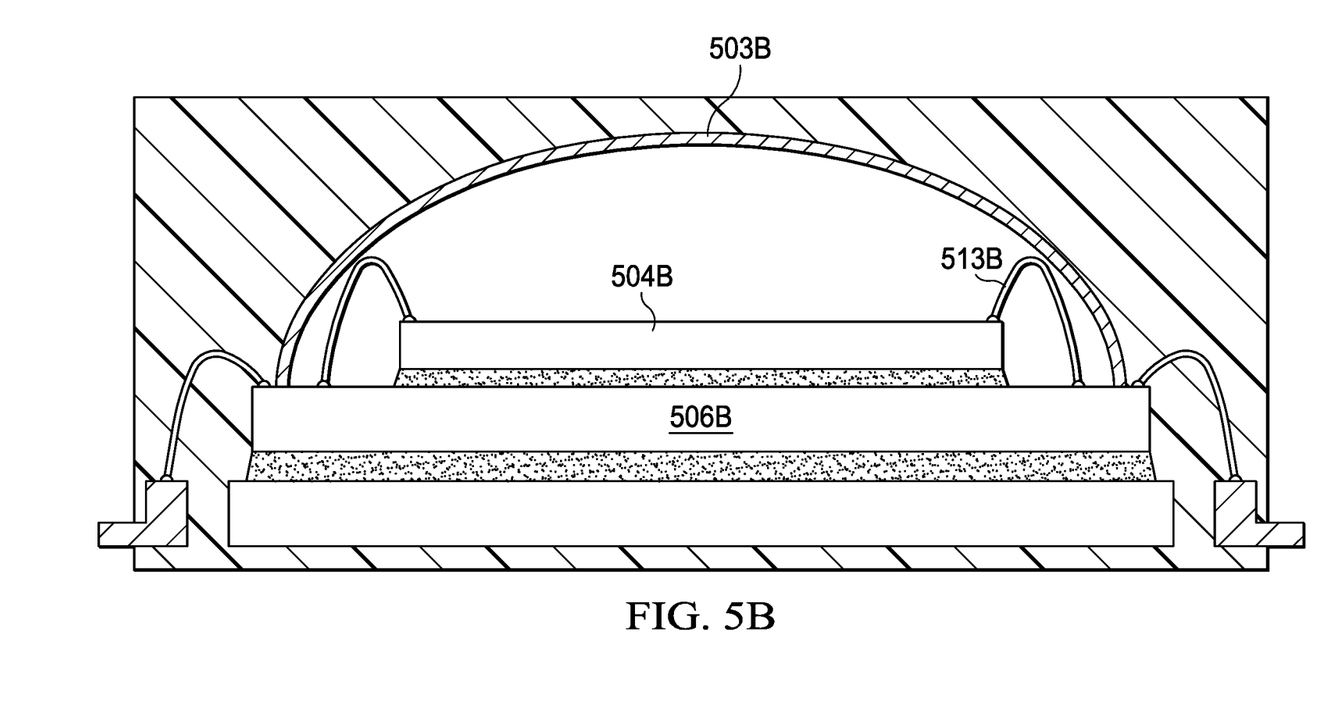
FIG. 5B illustrates a cross-sectional view of a full protective shell having a dome shape according to an implementation of the disclosure.

Implementations described so far, focused a semiconductor packaging with semiconductor dies partially covered by a protective shell (i.e., not the entire semiconductor die is covered). Referring to FIGS. 5A and 5B, cross-sectional views of protective shells covering the entire semiconductor dies are shown according to different implementations of the disclosure. Most aspects of forming a full protective shell are similar to discussion above with reference to a partial protective shell, and hence are not discussed again to avoid repetition.

Unlike a partial protective shell that could be implemented both on the wafer-level and packaging-level, the full protective shell may only be implemented after dicing of the wafer. Furthermore, in this implementation, an interposer is used to provide a base for the formation of the full protective shell. Referring to FIG. 5A, a semiconductor package 555 is shown, including a semiconductor die 504 attached to the top surface of an interposer 506 using a first layer of die attach 505. The semiconductor die 504 has a smaller diameter than the interposer 506, therefore, forming an exposed surface 5061 on the top surface of the interposer 506. The interposer 506 is further attached to the top surface of a lead frame 508 (e.g., lead frame) using a second layer of die attach 507. The interposer 506 is an electrical interface routing electrical connections from the semiconductor die 504 to Leads 502 (e.g., lead fingers). For example, the first wire bond 513 is used to connect the one or more bond pads of the semiconductor die 504 to the interposer 506 and the second wire bond 523 is used to direct the electrical signals from the interposer 506 to the Lead 502.

The interposer 506 also provides a base for placement of the full protective shell 503. In an implementation, a footer is formed on the exposed surface 5061 of the interposer 506 according to the disclosed implementation with reference to FIGS. 2A to 2C. Then, the full protective shell 503 is formed on top of the footers. In an alternative implementation, the full protective shell 503 is formed directly on the exposed surface 5061 of the interposer 506. The full protective shell 503 is formed using 3D printing technology as described above such that the semiconductor die 504 is placed within the inner space of shell structure. In an instance, as described previously with respect to the partial protective shells of FIGS. 3A and 3B, the full protective shell 503 may form a hermetic seal with the top surface of the interposer 506.

The full protective shell 503 further includes one or more support columns 5031. The support columns 5031 are formed and have the same characteristics as the support columns of partial protective shell described with reference to FIGS. 4A and 4B. There are one or more support columns 5031 formed on the top surface of the semiconductor die 504. There may also be one or more support columns 5031 formed on the exposed surface 5061 of the interposer 506 (not shown).

Referring to FIG. 5B, a full protective shell is designed in a dome shape according to an implementation of the disclosure. The full protective shell 503B does not include any supportive columns. In an example, both the semiconductor die 504B and the wire bond 513B, which is used to connect the semiconductor die 504B to the interposer 506B, is encapsulated within the protective shell 503B.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A semiconductor package, comprising:
    a semiconductor die attached to a substrate, wherein the semiconductor die includes a first surface;
    a cured ink covering at least a first portion of the first surface of the semiconductor die;
    a layer of molding compound covering an outer surface of the cured ink and a second portion of the first surface of the semiconductor die; and
    a cavity space between an inner surface of the cured ink and the first portion of the first surface of the semiconductor die, wherein the cured ink further comprises one or more support columns.

2. The semiconductor package of claim 1, wherein the cured ink is shaped as at least one of a rounded edge cuboid and a geodesic dome.

3. The semiconductor package of claim 1, wherein the cavity space is filled with at least one of an inert gas, air, and thermal grease.

4. The semiconductor package of claim 1, wherein the first portion of the first surface of the semiconductor die is less than an entire first surface of the semiconductor die.

5. The semiconductor package of claim 1, wherein the cured ink is made from one of a metal, ceramic, and thermoplastic.

6. The semiconductor package of claim 1, wherein the one or more support columns are formed to conduct heat from the semiconductor die.

7. A semiconductor package, comprising:
    an interposer having a first side and a second side;

a substrate attached to the second side of the interposer;
a semiconductor die attached to the first side of the interposer, wherein an exposed surface of the first side of the interposer is not covered by the semiconductor die;
an ink residue on the exposed surface of the interposer, wherein the ink residue covers a first surface of the semiconductor die;
at least one support structure contacting the ink residue and the first surface of the semiconductor die; and
a layer of molding compound covering an outer surface of the ink residue and a remaining portion of the exposed surface of the first side of the interposer.

8. The semiconductor package of claim 7, wherein the ink residue is shaped as at least one of a rounded edge cuboid and a geodesic dome.

9. The semiconductor package of claim 7 further comprising a cavity formed between an inner space of the ink residue and the first surface of the semiconductor die covered by the ink residue, wherein the cavity is filled with at least one of an inert gas, air, and thermal grease.

10. The semiconductor package of claim 9, wherein the at least one support structure is within the cavity.

11. The semiconductor package of claim 7, wherein the semiconductor die is electrically connected to the interposer covered by the ink residue, and the interposer is electrically connected to the substrate.

12. The semiconductor package of claim 7, wherein the ink residue is made from one of a metal, ceramic, and thermoplastic.

13. The semiconductor package of claim 7, wherein the at least one support structure is formed on the top surface of the semiconductor die.

14. A semiconductor package comprising:
a semiconductor die having a first surface;
a cured ink covering a first portion of the first surface of the semiconductor die, wherein the cured ink creates a hermetic seal with the first surface of the semiconductor die; and
at least one support structure contacting the cured ink and the first surface of the semiconductor die, wherein the first portion of the semiconductor die is less than an entire surface of the first surface of the semiconductor die.

15. The semiconductor package of claim 14, wherein the cured ink is formed by printable material.

16. The semiconductor package of claim 14, wherein the cured ink is shaped as at least one of a rounded edge cuboid and a geodesic dome.

17. The semiconductor package of claim 14, wherein the cured ink is made from one of a metal, ceramic, and thermoplastic.

18. The semiconductor package of claim 14, wherein an area within the hermetic seal is filled with at least one of an inert gas, air, and thermal grease.

19. The semiconductor package of claim 14, wherein the cured ink is 3D printed.

* * * * *